United States Patent
Akiyama

(10) Patent No.: US 6,891,210 B2
(45) Date of Patent: May 10, 2005

(54) SEMICONDUCTOR DEVICE HAVING A PROTECTION CIRCUIT

(75) Inventor: Naoto Akiyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/606,836

(22) Filed: Jun. 27, 2003

(65) Prior Publication Data

US 2004/0004229 A1 Jan. 8, 2004

(30) Foreign Application Priority Data

Jul. 2, 2002 (JP) ........................................ 2002-193018

(51) Int. Cl.[7] .......................... H01L 29/76; H01L 29/94; H01L 31/062; H01L 31/113
(52) U.S. Cl. ........................ 257/288; 257/356; 257/392; 257/500
(58) Field of Search ................................. 257/355–357, 257/360, 402, 393, 406, 392, 288, 500

(56) References Cited

U.S. PATENT DOCUMENTS

| | | | | |
|---|---|---|---|---|
| 5,239,195 A | * | 8/1993 | Compagne | 257/360 |
| 5,646,808 A | * | 7/1997 | Nakayama | 361/56 |
| 6,198,140 B1 | * | 3/2001 | Muramoto et al. | 257/392 |
| 6,465,308 B1 | * | 10/2002 | Cheng et al. | 438/289 |
| 2001/0045670 A1 | * | 11/2001 | Nojiri | 257/786 |
| 2003/0173630 A1 | * | 9/2003 | Lin et al. | 257/406 |

* cited by examiner

*Primary Examiner*—Shouxiang Hu
(74) *Attorney, Agent, or Firm*—Foley & Lardner LLP

(57) ABSTRACT

The semiconductor device includes a plurality of transistors, wherein one of the transistors that has the thinnest gate dielectric layer is selected to serve as a power source protection element, among a plurality of transistors, each having a gate dielectric layer of an independently set film thickness, disposed on a same substrate to be operated by a voltage from a same power source. Also, a threshold voltage of the transistor selected as the power source protection element is set higher than other transistor that also has the thinnest gate dielectric layer.

8 Claims, 9 Drawing Sheets

FIG. 3

|  | Internal Circuit | | Power Source Protector | I/O (External Interface) |
|---|---|---|---|---|
|  | Mcore | Lcore | Mpcore(HVt-M) |  |
| thickness of gate dielectric layer (nm) | 1.9 | 2.6 | 1.9 | (7.2) |
| operating voltage (V) | 1.2 | 1.2 | 1.2 | (3.3) |
| threshold voltage Vt | low | high | higher than Mcore |  |
| leak/off current | large | small | smaller than Mcore |  |
| speed | high | low |  |  |
| power consumption | large | small |  |  |
| breakdown voltage of gate dielectric layer | low (about 5V) | high (about 7V) | same as Mcore | (high, about 10V) |

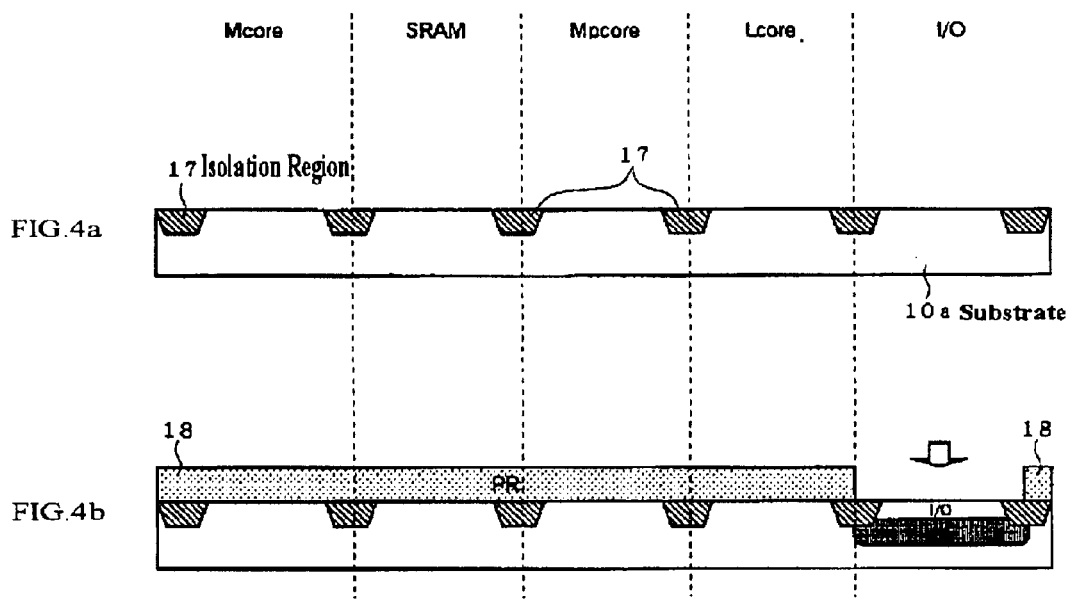

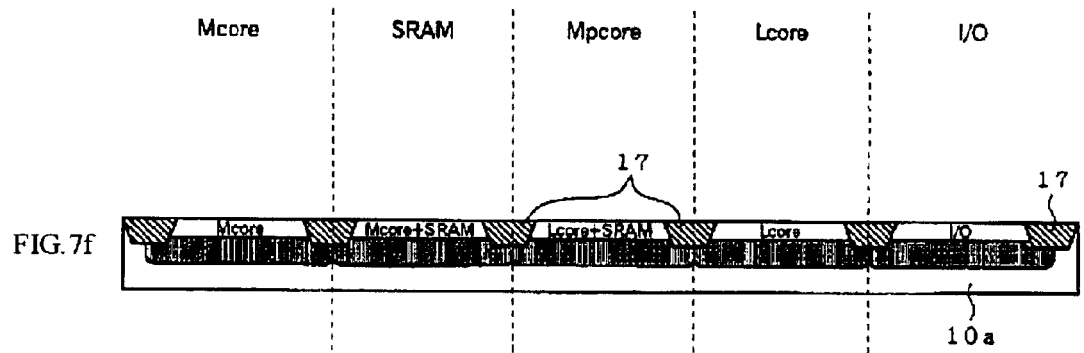
FIG. 7f
FIG. 7g
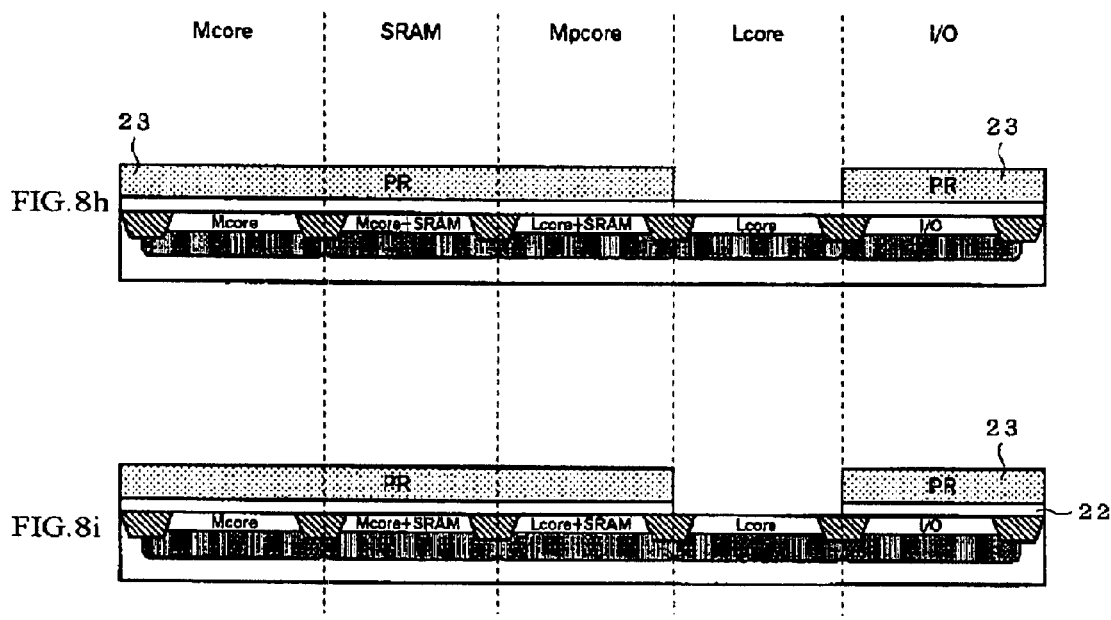
FIG. 8h
FIG. 8i

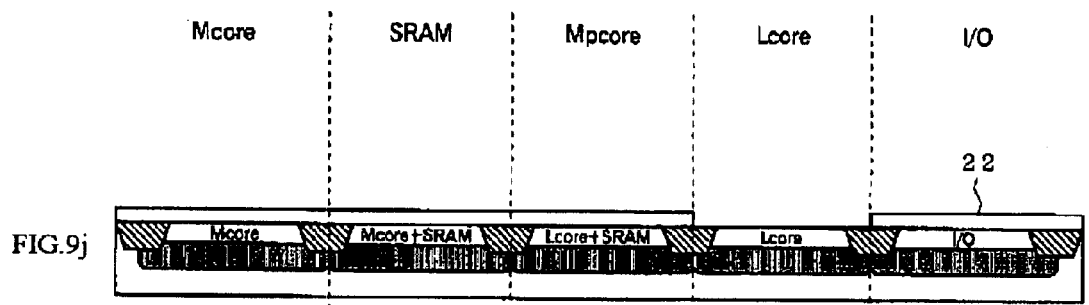
FIG.9j
FIG.9k
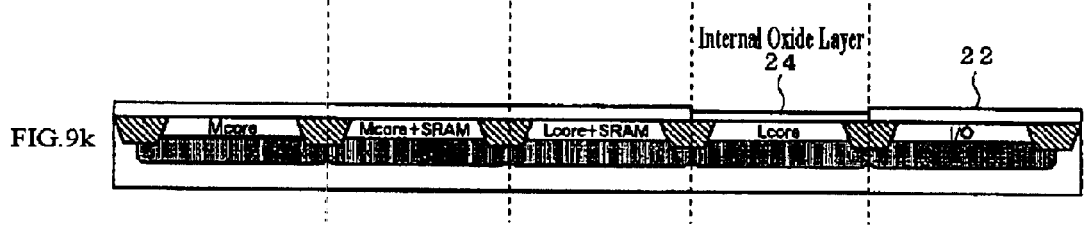
FIG.10l
FIG.10m

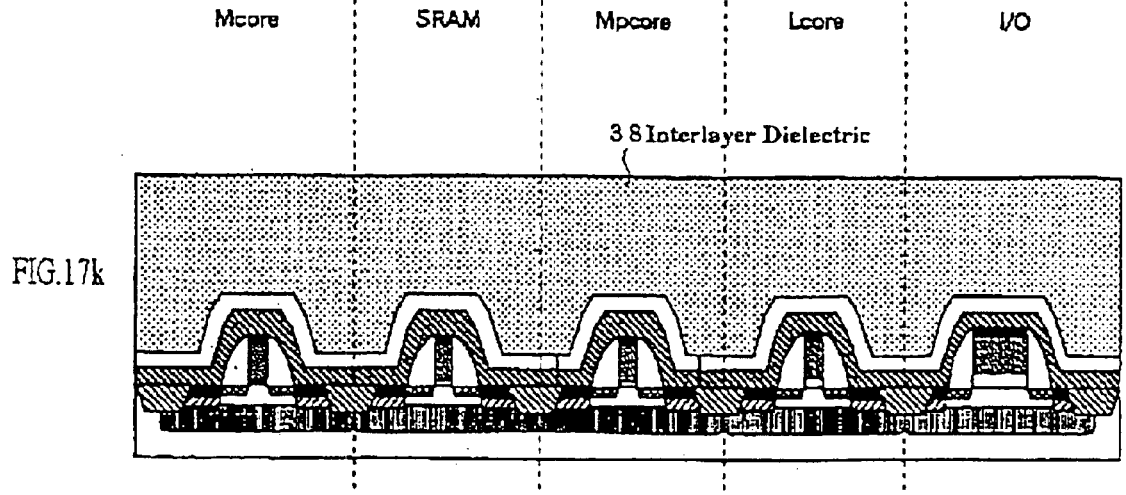
FIG.17k
FIG. 18
Prior Art
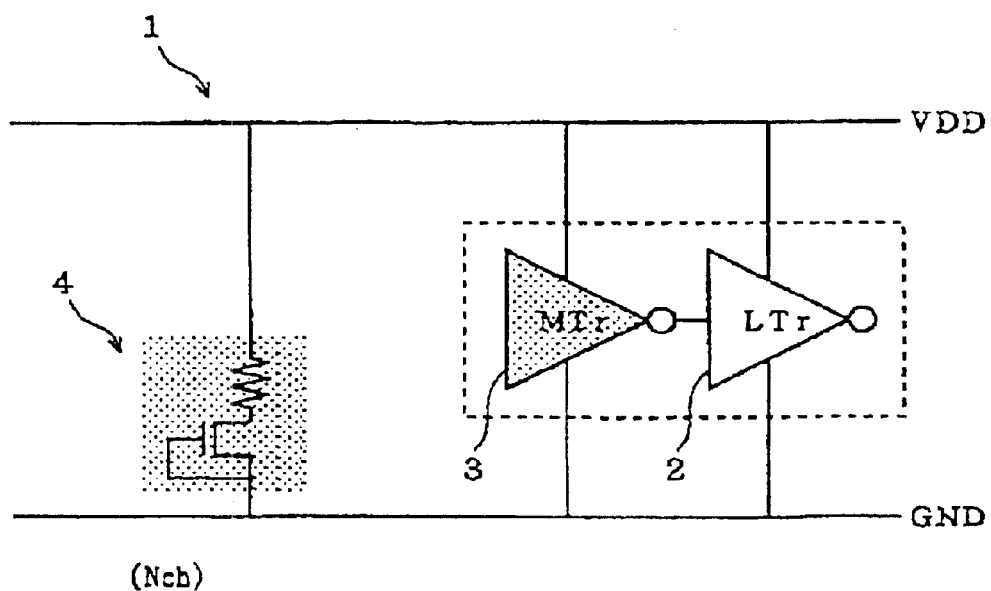

SEMICONDUCTOR DEVICE HAVING A PROTECTION CIRCUIT

This application is based on Japanese patent application NO.2002-193018, the content of which is incorporated hereinto by reference.

BACKGROUND OF THE INVENTION

1. Field of the Invention

The present invention relates to a semiconductor device and manufacturing method thereof, more specifically to a semiconductor device provided with a protection circuit or element suitable for a high speed and low power consumption type LSI (large scale integrated circuit), and a manufacturing method of such semiconductor device.

2. Description of the Related Art

An LSI provided with an MOS (metal oxide semiconductor) device has become very popular. The LSI includes an internal circuit constituted of a CPU (central processing unit), memory circuit, etc. and an I/O (input/output) port for external interface disposed around the internal circuit.

FIG. 18 shows apart of an internal circuit of a conventional LSI. The internal circuit 1 of the LSI constitutes a hybrid circuit consisting of two types of transistor (Tr) groups, namely LTr2 and MTr3. An objective of providing the LTr2 and MTr3 together is to satisfy the both requirements of higher processing speed and lower power consumption at a same time.

The LTr2 and MTr3 in the internal circuit 1 are operated under a same operating voltage while a threshold voltage Vt of the LTr2 is set higher and that of the MTr3 lower, therefore the LTr2 has a slow processing speed but consumes less power while the MTr3 has a high processing speed but consumes more power. Gate dielectric layers of the transistors constituting the LTr2 and MTr3, for each of which a threshold voltage is independently set, have a different film thickness, for example the film thickness of the LTr2 transistor is approx. 2.6 nm while that of the MTr3 transistor is approx. 1.9 nm.

The LSI provided with such the MOS device needs to include a power source protection circuit which serves to prevent a breakdown of a dielectric layer of the MOS device, since the gate dielectric layer is not resistant to an over current and easily breaks once an over current runs through it. This is because, ever since multi-oxide process was adopted in the manufacturing process aiming at a higher processing speed and lower power consumption by an LSI, as the gate dielectric layer has become thinner a breakdown voltage of the gate dielectric layer has lowered accordingly, from approx. 10V at a film thickness of approx. 8.0 nm to approx. 5V to 7V at a thickness of approx. 3.0 nm.

The power source protection circuit 4 to be incorporated in the internal circuit 1 of the LSI can be constituted of, for example, an N-channel transistor of a diode connection type.

As for the hybrid circuit as shown in FIG. 1, the power source protection circuit 4 needs to have functions to protect the MTr3 which has thinner gate dielectric layer and has a lower breakdown voltage. In addition to the above functions, the power source protection circuit 4 should be designed to reduce leak or off current therefrom especially when it is adopted to a low-consumption type LSI that is popularly used in a portable apparatus in order to reduce energy consumption.

Under the current circumstances in which the issue of the leak current and breakdown voltage has become more critical, increasing the leak current incurs so significant inconvenience that it is difficult to satisfy the both aspects of the leak current and the breakdown voltage.

SUMMARY OF THE INVENTION

The present invention provides a semiconductor device comprising a plurality of transistors, each having a gate dielectric layer of an independently set film thickness, disposed on a same substrate to be operated by a voltage from a same power source, wherein a transistor that has a thinnest gate dielectric layer among the plurality of transistors is used as a power source protection element.

In such semiconductor device, a threshold voltage of the transistor serving as the power source protection element may be set higher than a threshold voltage of a transistor having the thinnest gate dielectric layer. By this arrangement the leak current can be reduced, therefore the both requirements of the leak current and the breakdown voltage can be satisfied at a time.

According to the present invention, there is provided a semiconductor device comprising: a substrate; and a plurality of transistors formed on the substrate to be operated by a voltage generated by a same power source, each of the transistors having a gate dielectric layer, and the plurality of transistors including transistors thickness of which is different from each other, wherein one of the plurality of transistors that has the thinnest gate dielectric layer is selected to serve as a power source protection element.

As the transistor including the thinnest gate dielectric layer is selected to serve as the power source protection element, the rest of the transistors can be protected by the selected transistor.

The transistor selected to serve as the power source protection element may be set to have a threshold voltage higher than that of a transistor that has a gate dielectric layer thickness of which is same as the selected transistor or thinner than the rest of the plurality of transistors other than the selected transistor.

As the transistor selected to serve as the power source protection element is set to have a higher threshold voltage, leak or off current therefrom can be reduced.

The plurality of transistors may be manufactured through a multi-oxide process for forming two or more gate dielectric layers each having a different film thickness, and the plurality of transistors may include at least three types of transistors each having different combinations of thickness of the gate dielectric layer and threshold voltage from each other.

The plurality of transistors may be disposed in an internal circuit surrounded by an I/O port.

The plurality of transistors may include a high speed processing type transistor and a low power consumption type transistor. The transistor selected to serve as the power source protection element may have higher threshold voltage than that of the high speed processing type transistor. The transistor selected to serve as the power source protection element may have a dielectric layer thickness of which is same as or thinner than that of the high speed processing type transistor. The leak current of the transistor selected to serve as the power source protection element may be smaller than that of the high speed processing type transistor.

According to the present invention, there is provided a manufacturing method of a semiconductor device. The method comprises the step of forming an internal circuit including a plurality of transistor groups each having a gate dielectric layer of an independently set film thickness on a substrate, wherein one of the transistors is formed as a power source protection element during the step of forming the internal circuit without performing an additional process.

In the method, one of the transistors having the thinnest gate dielectric layer maybe formed as the power source protection element.

In the method, the step of forming the internal circuit may include forming gate dielectric layers of the power source protection element and at least one of the transistors at a same time; and a channel dosage for the power source protection element may be more than a channel dosage for the at least one of the transistors.

In the method, the step of forming the internal circuit may include forming gate dielectric layers of the power source protection element and at least one of the transistors at a same time; and a channel dosage for the power source protection element is more than a channel dosage for the at least one of the transistors.

In the method, the channel dosage for the power source protection element may be equal to a total channel dosage for at least two of the transistors included in the internal circuit.

In the method, the step of forming the internal circuit may include: performing a first impurity ion implantation into a first forming region of a first transistor other than the power source protection element included in the transistors; and performing a second impurity ion implantation into a second forming region of a second transistor other than the power source protection element or the first transistor included in the transistors; wherein the first impurity ion implantation and the second impurity ion implantation may be performed into a region of the power source protection element for adjusting a threshold voltage of the power source protection element.

Also, through a manufacturing method according to the invention, the above semiconductor device can be obtained.

It is to be noted that any arbitrary combination of the above-described structural components and expressions changed between a method, an apparatus, a system and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

FIG. 3 is a cross-reference comparison table of functions of the internal circuit, power source protection circuit and input/output port of FIG. 1.

FIG. 4a is a schematic cross-sectional drawing for progressively explaining a manufacturing method of the semiconductor device shown in FIG. 1.

FIG. 4b is a schematic cross-sectional drawing for progressively explaining a manufacturing method of the semiconductor device shown in FIG. 1.

FIG. 7f is a schematic cross-sectional drawing for progressively explaining a manufacturing method of the semiconductor device shown in FIG. 1.

FIG. 7g is a schematic cross-sectional drawing for progressively explaining a manufacturing method of the semiconductor device shown in FIG. 1.

FIG. 8h is a schematic cross-sectional drawing for progressively explaining a manufacturing method of the semiconductor device shown in FIG. 1.

FIG. 8i is a schematic cross-sectional drawing for progressively explaining a manufacturing method of the semiconductor device shown in FIG. 1.

FIG. 9j is a schematic cross-sectional drawing for progressively explaining a manufacturing method of the semiconductor device shown in FIG. 1.

FIG. 9k is a schematic cross-sectional drawing for progressively explaining a manufacturing method of the semiconductor device shown in FIG. 1.

FIG. 10l is a schematic cross-sectional drawing for progressively explaining a manufacturing method of the semiconductor device shown in FIG. 1.

FIG. 10m is a schematic cross-sectional drawing for progressively explaining a manufacturing method of the semiconductor device shown in FIG. 1.

FIG. 17k is a schematic cross-sectional drawing for progressively explaining a manufacturing method of the semiconductor device shown in FIG. 1.

FIG. 18 is a circuit diagram of an internal circuit of a conventional LSI.

PREFFERED EMBODIMENT OF THE PRESENT INVENTION

The invention will now be described based on preferred embodiments which do not intend to limit the scope of the present invention but exemplify the invention. All of the features and the combinations thereof described in the embodiment are not necessarily essential to the invention.

Figure 1:
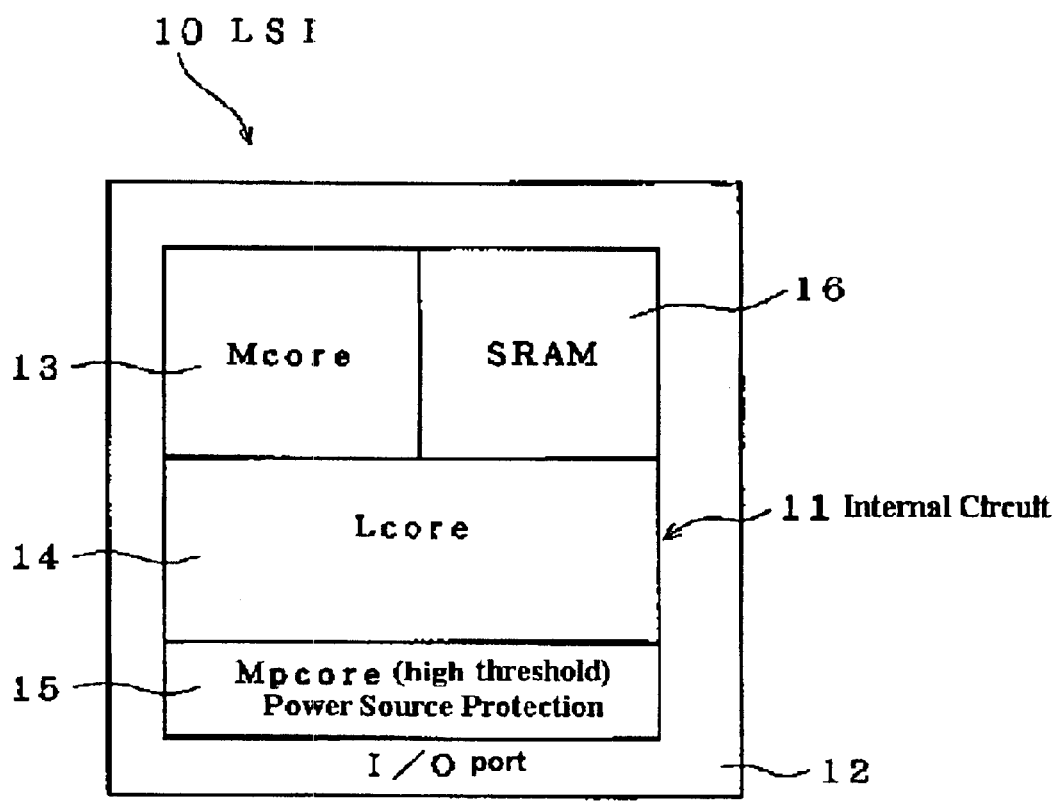
FIG. 1 is a schematic plan view showing an internal constitution of a semiconductor device according to the embodiment of the present invention.

FIG. 1 is a schematic plan view showing an internal constitution of a semiconductor device (an LSI) according to the embodiment of the present invention.

As shown in FIG. 1, the LSI 10 provided with an MOS device includes an internal circuit 11 and an I/O port 12 for external interface disposed around the internal circuit 11.

The internal circuit 11 is constituted of an Mcore 13, an Lcore 14, an Mpcore 15 and an SRAM (static random access memory) 16, each consisting of transistor groups of different types, specifically designed for use in the internal circuit 11.

The internal circuit 11 constitutes a hybrid circuit including the Mcore 13 for high speed processing and the Lcore 14 for reduction of power consumption, with an object to satisfy the both requirements of higher processing speed and lower power consumption at a time. In this embodiment, Mpcore 15 serves as a power source protection circuit or element.

Figure 2:
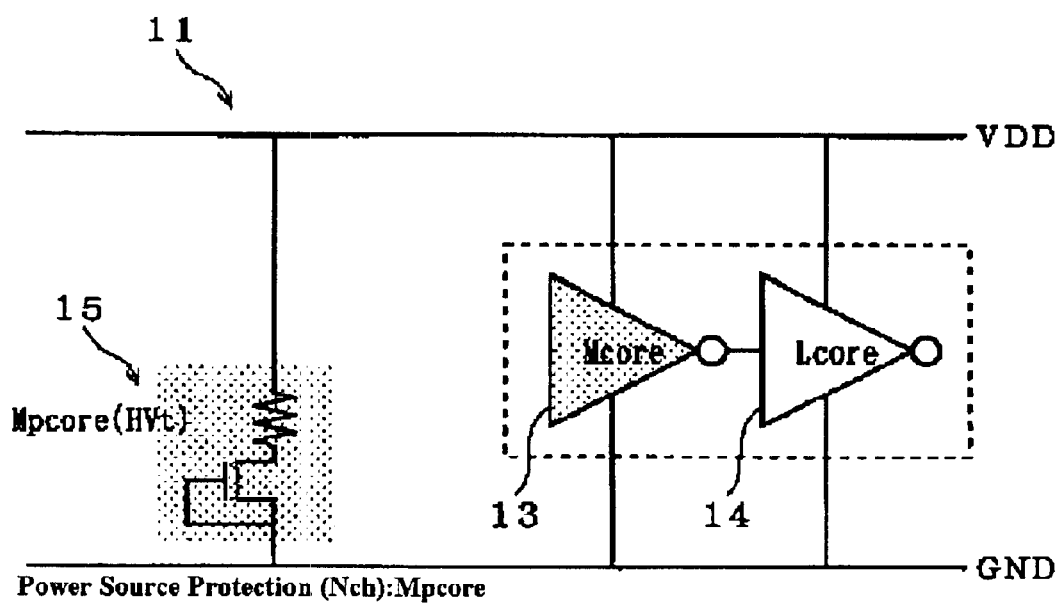
FIG. 2 is a circuit diagram of a part of the internal circuit of FIG. 1.

FIG. 2 is a circuit diagram of apart of the internal circuit 11 shown in FIG. 1.

The Mpcore 15 is constituted of an N-channel transistor of diode connection type for example, for serving as a power source protection circuit when activated by an increase of a threshold voltage of the Mcore 13 (HVt-M).

FIG. 3 is a cross-reference comparison table of functions of the Mcore 13, the Lcore 14, the Mpcore 15 which serves as the power source protection circuit of the internal circuit 11 and the I/O port 12 shown in FIG. 1. According to the table of FIG. 3, for example, the threshold voltage (Vt) is independently set for the Mcore 13 and the Lcore 14. The Mcore 13 is constituted to have lower threshold voltage (for instance approx. 0.35V) than that of the Lcore 14 (approx. 0.47V as an example).

As for the thickness of the gate dielectric layer, the thickness of the gate dielectric layer (approx. 1.9 nm) of the Mcore 13 is thinner than that (approx. 2.6 nm) of the Lcore 14.

In this embodiment, the gate dielectric layer is constituted of $SiO_2$, while it is also possible to use a dielectric layer of SiON, $Si_3N_4$, $TiO_2$ (titan oxide), $Al_2O_3$ (aluminum oxide), $ZrO_2$ (zirconium oxide), $HfO_2$ (hafnium oxide), etc.

Operating voltage is equally 1.2V for both of the Mcore 13 and the Lcore 14, while the Mcore 13 has larger leak or off current than that of the Lcore 14. Referring to processing speed, the Mcore 13 is faster than the Lcore 14, and the Mcore 13 consumes more energy than the Lcore 14, and the Mcore 13 has a lower breakdown voltage at its gate dielectric layer (approx. 5V) than that (approx. 7V) of the Lcore 14.

Also referring to a comparison between Mpcore 15, which serves as the power source protection circuit, and the Mcore 13, the threshold voltage Vt is set higher for the Mpcore 15 than for the Mcore 13, and the thickness of the gate dielectric layer is equally approx. 1.9 nm for both. The operating voltage for the Mpcore 15 is also 1.2V which is the same as Mcore 13 and the Lcore 14, while the Mpcore 15 has lower leak or off current than the Mcore 13, and has the same gate dielectric layer breakdown voltage (approx. 5V) as the Mcore 13.

Further regarding the I/O port (external interface) 12, the thickness of the gate dielectric layer is approx. 7.2 nm, operating voltage is approx. 3.3V, and the breakdown voltage of the gate dielectric layer is as high as approx. 10V.

FIGS. 4a through 17k are schematic cross-sectional drawings for progressively explaining a manufacturing method of the semiconductor device as shown in FIG. 1. These drawings are showing only a forming process of an N-channel transistor of the LSI 10 provided with an MOS device.

As shown in FIGS. 4a through 17k, firstly an element isolation region 17 is formed on a substrate 10a (FIG. 4a). After forming a field photoresist on the substrate 10a by photolithography a shallow trench of approx. 300 nm in depth is patterned, into which an HD (high density plasma) oxide layer of approx. 500 nm in thickness is filled, and then CMP (chemical mechanical polishing) is performed for forming the element isolation region 17.

Following the above the N-channel transistors (wells and channels) are formed as will be described in the followings.

A photoresist (PR) 18 for ion implantation on the I/O port is formed on the substrate 10a, and into a forming region of the I/O port N-channel transistor where an opening is provided on the photoresist 18, ion implantation of boron employed as an impurity for forming a well is performed under a condition of 80 keV, $5.0 \times 10^{12}/cm^2$, 0 degree centigrade, and then ion implantation of boron for adjusting a threshold voltage is performed under a condition of 20 keV, $2.7 \times 10^{12}/cm^2$, 0 degree centigrade (FIG. 4b).

Figure 5C:
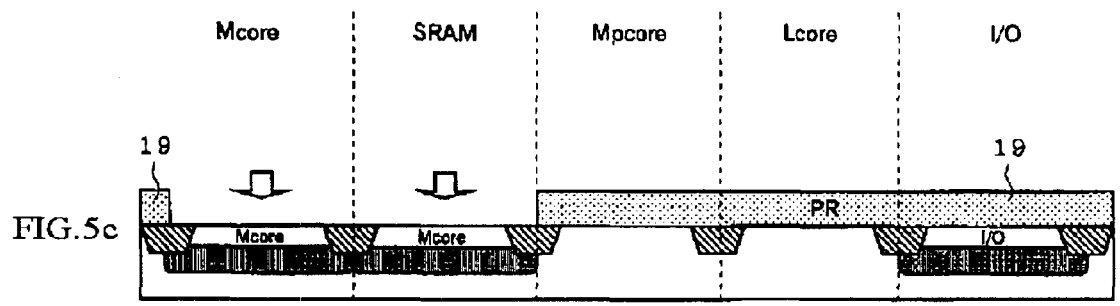
FIG. 5c is a schematic cross-sectional drawing for progressively explaining a manufacturing method of the semiconductor device shown in FIG. 1.

After executing the ion implantation on the I/O port, a photoresist 19 for ion implantation on the Mcore is formed, and into respective forming regions of the Mcore and the SRAM N-channel transistors where an opening is provided on the photoresist 19, ion implantation of boron employed as an impurity for forming a well is performed under a condition of 150 keV, $2.0 \times 10^{13}/cm^2$, 0 degree centigrade, and then ion implantation of boron for adjusting a threshold voltage is performed under a condition of 15 keV, $9.4 \times 10^{12}/cm^2$, 7 degrees centigrade (FIG. 5c).

Figure 5D:
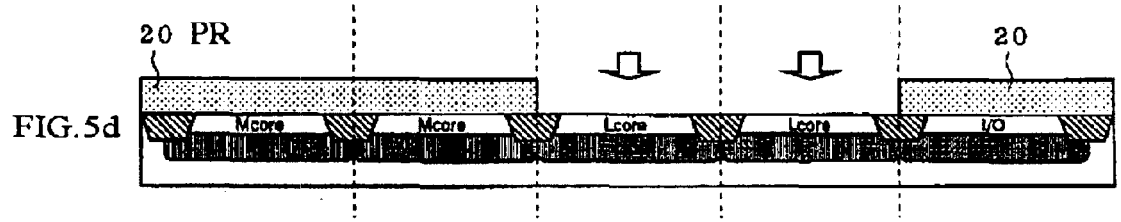
FIG. 5d is a schematic cross-sectional drawing for progressively explaining a manufacturing method of the semiconductor device shown in FIG. 1.

After executing the ion implantation on the Mcore, a photoresist 20 for ion implantation on the Lcore is formed, and into forming regions of the Mpcore (a power source protection N-channel transistor) and the Lcore N-channel transistor where an opening is provided on the photoresist 20, ion implantation of boron employed as an impurity for forming a well is performed under a condition of 150 keV, $2.0 \times 10^{13}/cm^2$, 0 degree centigrade, and then ion implantation of boron for adjusting a threshold voltage is performed under a condition of 15 keV, $1.2 \times 10^{13}/cm^2$, 7 degrees centigrade (FIG. 5d).

Figure 6E:
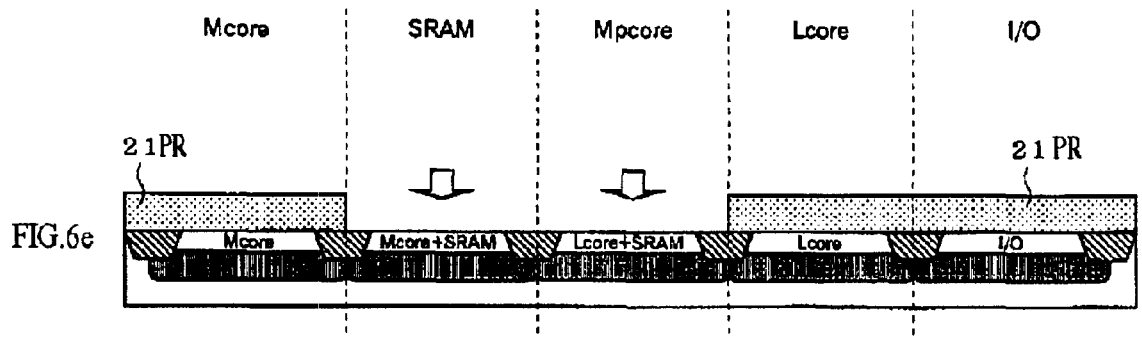
FIG. 6e is a schematic cross-sectional drawing for progressively explaining a manufacturing method of the semiconductor device shown in FIG. 1.

After executing the ion implantation on the Lcore, a photoresist 21 for ion implantation on the SRAM is formed, and into forming regions of the Mpcore (a power source protection N-channel transistor) and the SRAM N-channel transistor, where an opening is provided on the photoresist 21, additional ion implantation of boron employed as an impurity for adjusting a threshold voltage is performed under a condition of 15 keV, $4.1 \times 10^{12}/cm^2$, 0 degree centigrade (FIG. 6e). Here, a threshold voltage of the SRAM 16 is independently controlled (a threshold voltage of the Mpcore is dependent).

Following the above, the P-channel transistors (wells and channels) are formed. A forming process of the P-channel transistors, which is similar to that of the above N-channel transistors, shall be described hereunder omitting drawings.

For forming the P-channel transistors, a photoresist for ion implantation on the I/O port is formed, and into a forming region of an I/O port P-channel transistor where an opening is provided on the photoresist, ion implantation of phosphor employed as an impurity for forming a well is performed under a condition of 400 keV, $1.5\times10^{13}/cm^2$, 0 degree centigrade, and then ion implantation of arsenic for adjusting a threshold voltage is performed under a condition of 100 keV, $2.9\times10^{12}/cm^2$, 0 degree centigrade.

After executing the ion implantation on the I/O port, a photoresist for ion implantation on the Mcore is formed, and into a forming region of an Mcore P-channel transistor where an opening is provided on the photoresist, ion implantation of phosphor employed as an impurity for forming a well is performed under a condition of 400 keV, $1.5\times10^{13}/cm^2$, 0 degree centigrade, and then ion implantation of arsenic for adjusting a threshold voltage is performed under a condition of 100 keV, $8.3\times10^{12}/cm^2$, 0 degree centigrade.

After executing the ion implantation on the Mcore, a photoresist for ion implantation on the SRAM is formed, and into a forming region of an SRAM N-channel transistor where an opening is provided on the photoresist, ion implantation of phosphor employed as an impurity for forming a well is performed under a condition of 350 keV, $2.0\times10^{13}/cm^2$, 0 degree centigrade, and then ion implantation of arsenic for adjusting a threshold voltage is performed under a condition of 100 keV, $1.4\times10^{13}/cm^2$, 0 degree centigrade.

After forming the wells and channels of the P-channel transistors and the N-channel transistors, lamp annealing is performed in a nitrogen atmosphere at 1000 degrees centigrade, for 10 seconds (FIG. 7f).

A total ion dosage is as follows: $9.4\times10^{12}/cm^2$ for the Mcore forming region; $1.35\times10^{13}/cm^2$ for the SRAM forming region (Mcore+SRAM); $1.61\times10^{13}/cm^2$ for the Mpcore forming region (Lcore+SRAM); and $1.2\times10^{13}/cm^2$ for the Lcore forming region, based on which it is apparent that a greater dosage has been applied to the Mpcore forming region than to the Mcore forming region or the SRAM forming region.

Then, three types of gate dielectric layers, oxide layers in this embodiment, respectively having a different thickness are formed on the substrate 10a as will be explained in the followings.

Firstly thermal oxidation of the entire wafer surface is performed, so as to form a first internal oxide layer 22 of approx. 7.5 nm in thickness (FIG. 7g). Then a photoresist 23 for subsequent etching on the first internal oxide layer 22 is formed all over the wafer surface and an opening is made only at the Lcore forming region (FIG. 8h).

After forming the photoresist 23, wet etching is performed on the first internal oxide layer 22 to remove the first internal oxide layer 22 from the Lcore forming region (FIG. 8i), following which the photoresist 23 is removed (FIG. 9j).

After removing the photoresist 23, thermal oxidation of the entire wafer surface is performed, so as to form a second internal oxide layer 24 of approx. 2.6 nm in thickness in the Lcore forming region (FIG. 9k). Then a photoresist 25 for subsequent etching on the first internal oxide layer 22 and the second internal oxide layer 24 is formed all over the wafer surface and an opening is made only at the three forming regions, i.e. the Mcore forming region, the SRAM forming region and the Mpcore forming region (FIG. 10l).

Figure 11N:
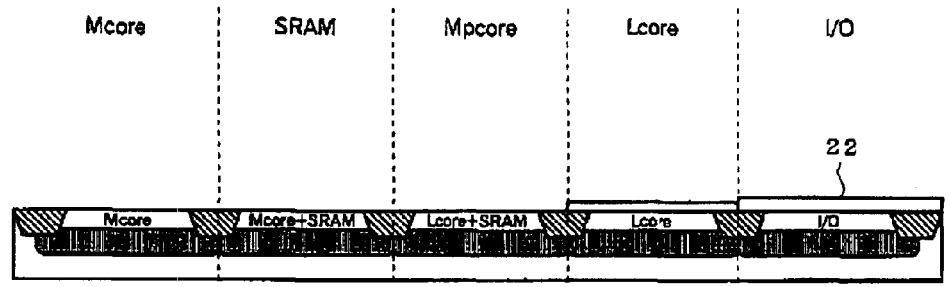
FIG. 11n is a schematic cross-sectional drawing for progressively explaining a manufacturing method of the semiconductor device shown in FIG. 1.

After forming the photoresist 25, wet etching is performed on the first internal oxide layer 22 to remove the first internal oxide layer 22 except from the I/O port forming region and the Lcore forming region, i.e. from the Mcore forming region, the SRAM forming region and the Mpcore forming region (FIG. 10m), following which the photoresist 25 is removed (FIG. 11n).

Figure 11O:
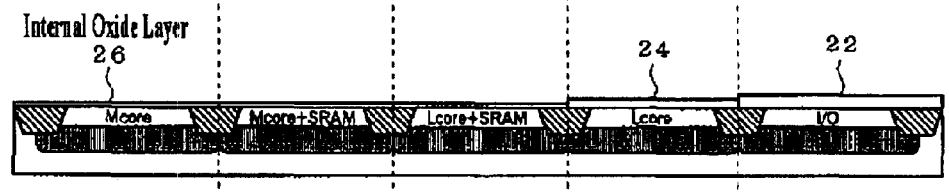
FIG. 11o is a schematic cross-sectional drawing for progressively explaining a manufacturing method of the semiconductor device shown in FIG. 1.

After removing the photoresist 25, thermal oxidation of the entire wafer surface is performed, so as to form a third internal oxide layer 26 of approx. 1.9 nm in thickness in the regions corresponding to the Mcore, the SRAM and the Mpcore (FIG. 11o).

Figure 12A:
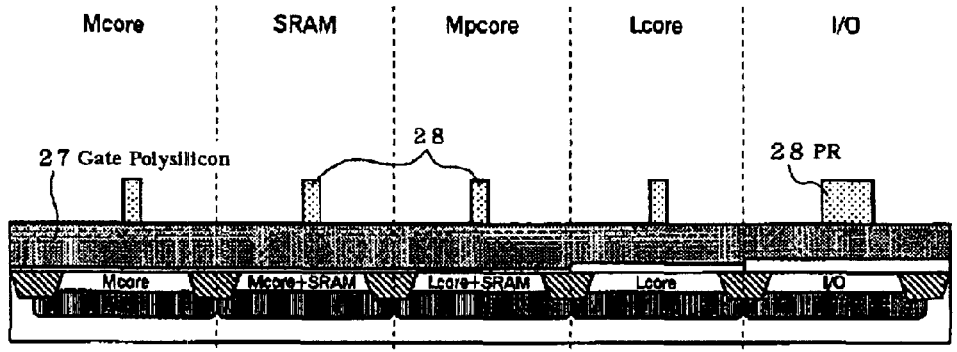
FIG. 12a is a schematic cross-sectional drawing for progressively explaining a manufacturing method of the semiconductor device shown in FIG. 1.
Figure 12B:
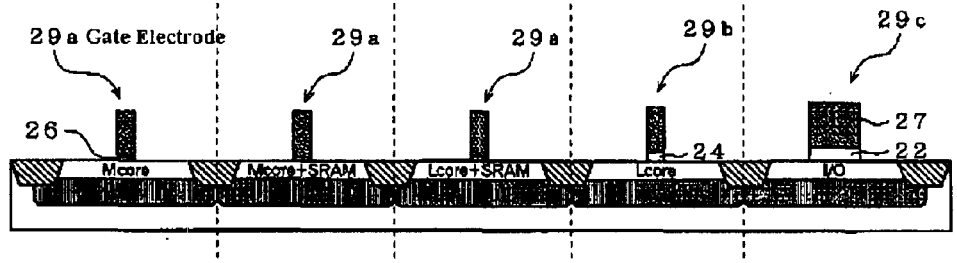
FIG. 12b is a schematic cross-sectional drawing for progressively explaining a manufacturing method of the semiconductor device shown in FIG. 1.

Then, a gate electrode is formed. A gate polysilicon 27 is grown up to a thickness of approx. 150 nm, and a photoresist 28 is formed for subsequent etching on the gate polysilicon 27 (FIG. 12a). After forming the photoresist 28, plasma etching is performed on the gate polysilicon 27, after which the photoresist 28 is removed (FIG. 12b).

As a result, gate electrodes 29a each having a gate length of approx. 0.1 μm is formed in the Mcore forming region, the SRAM forming region and the Mpcore forming region; a gate electrode 29b having a gate length of approx. 0.12 μm in the Lcore forming region; and a gate electrode 29c having a gate length of approx. 0.44 μm in the I/O port forming region, respectively.

Figure 13C:
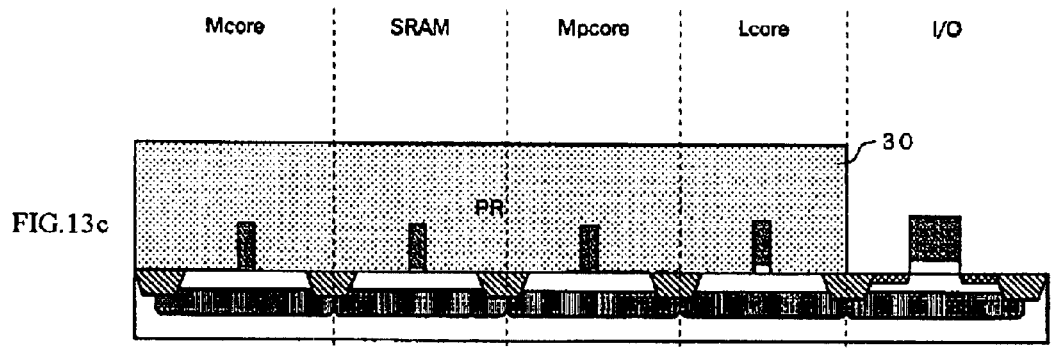
FIG. 13c is a schematic cross-sectional drawing for progressively explaining a manufacturing method of the semiconductor device shown in FIG. 1.

Following the above, a photoresist 30 is formed all over the wafer surface except the I/O port forming region, and phosphor is implanted into the I/O port N-channel transistor forming region so as to form an LDD (lightly doped drain) structure (FIG. 13c).

Figure 13D:
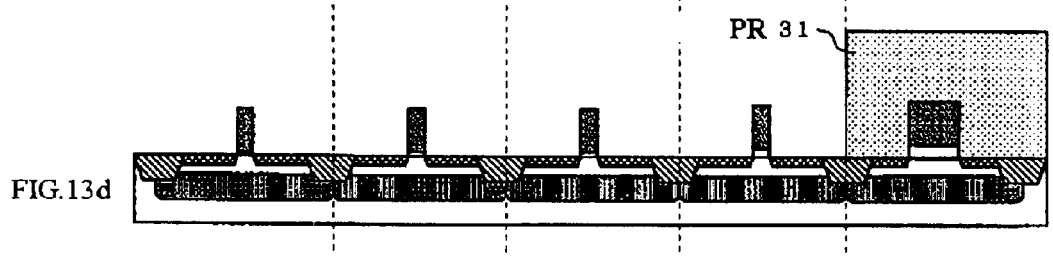
FIG. 13d is a schematic cross-sectional drawing for progressively explaining a manufacturing method of the semiconductor device shown in FIG. 1.

After removing the photoresist 30, a photoresist 31 is formed in the I/O port forming region, and $BF_2$ and arsenic are implanted into the N-channel transistor forming regions except the I/O port forming region, so as to form an extension and a pocket (FIG. 13d).

Figure 14E:
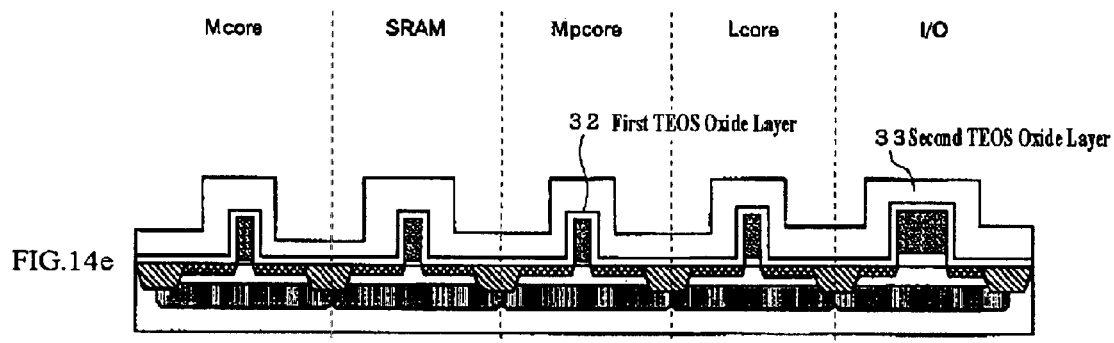
FIG. 14e is a schematic cross-sectional drawing for progressively explaining a manufacturing method of the semiconductor device shown in FIG. 1.
Figure 14F:
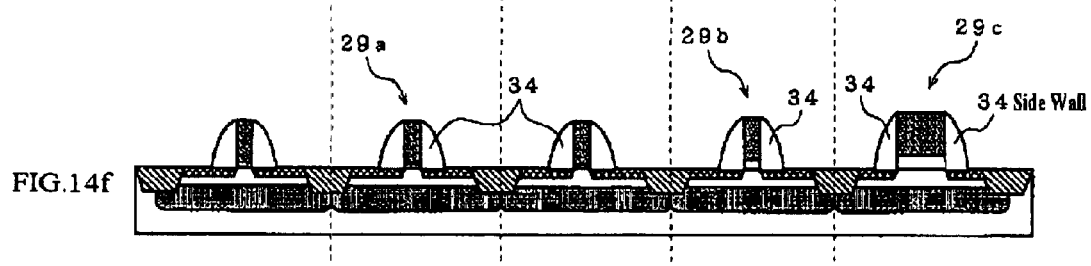
FIG. 14f is a schematic cross-sectional drawing for progressively explaining a manufacturing method of the semiconductor device shown in FIG. 1.

After that, a first TEOS (tetraethyl-orthosilicate) oxide layer 32 and a second TEOS oxide layer 33 are grown (FIG. 14e) Then etch-back is performed so that sidewalls 34 of the gate electrodes 29a, 29b and 29c are formed (FIG. 14f).

Figure 15G:
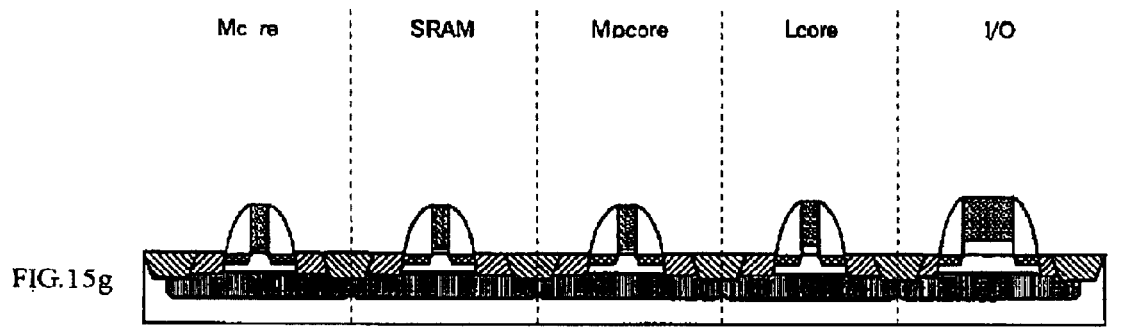
FIG. 15g is a schematic cross-sectional drawing for progressively explaining a manufacturing method of the semiconductor device shown in FIG. 1.
Figure 15H:
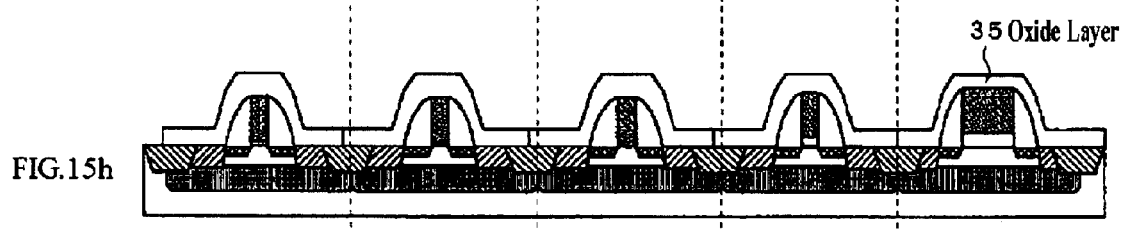
FIG. 15h is a schematic cross-sectional drawing for progressively explaining a manufacturing method of the semiconductor device shown in FIG. 1.

A photoresist is then formed, and boron ion is implanted into all the P-channel transistor forming regions and arsenic is implanted into all the N-channel transistor forming regions, so that SD (source/drain) regions are formed (FIG. 15g). Then an oxide layer 35 is grown all over the wafer surface so as to cover the gate electrodes 29a, 29b and 29c and lamp annealing is performed (FIG. 15h).

Figure 16I:
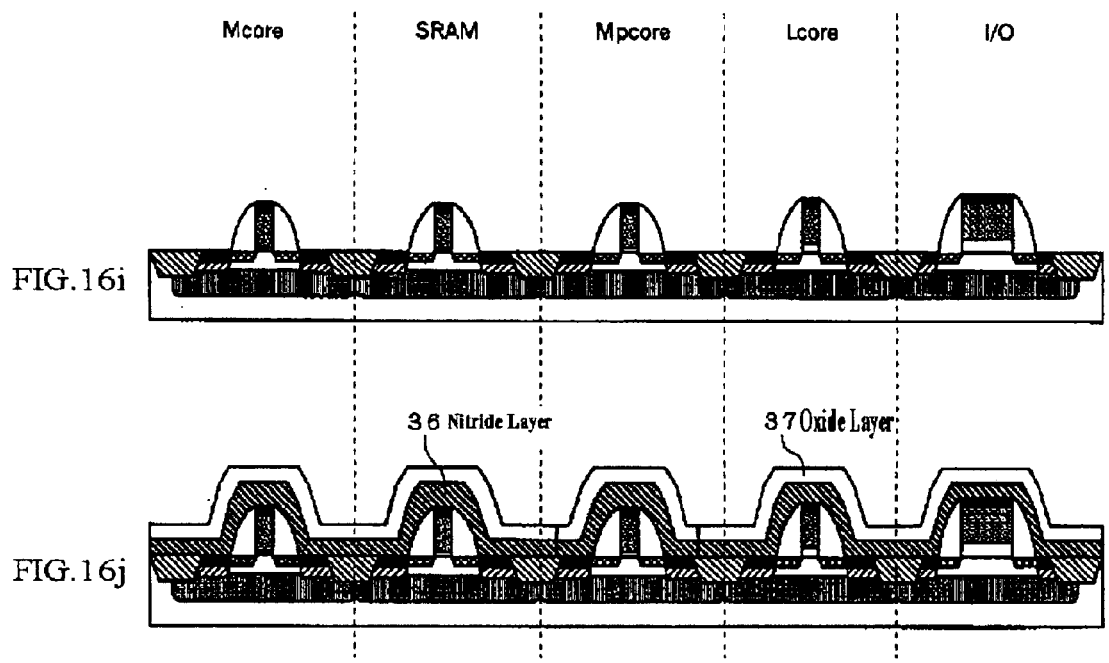
FIG. 16i is a schematic cross-sectional drawing for progressively explaining a manufacturing method of the semiconductor device shown in FIG. 1.
Figure 16J:
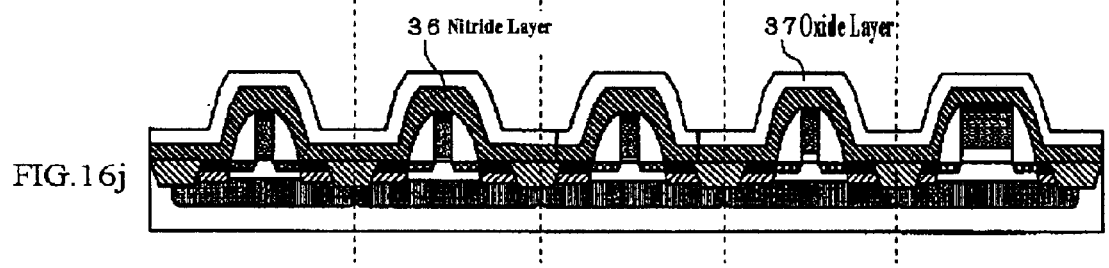
FIG. 16j is a schematic cross-sectional drawing for progressively explaining a manufacturing method of the semiconductor device shown in FIG. 1.

After the above, cobalt sputtering and etching for removing excessive cobalt is performed, so that cobalt silicide ($CoSi_2$) is formed (FIG. 16i). Then, an etch-stopper nitride layer 36 and an oxide layer 37 for performing contact etching are grown (FIG. 16j).

Then ozone TEOS BPSG (boron phosphor silicate glass) is grown up to a thickness of approx. 800 nm, after which CMP is performed for planarization. As a result, an inter-layer dielectric film 38 is formed (FIG. 17k).

As described above, in the LSI 10 provided with an MOS device the transistors having an oxide layer of three different film thickness are formed, and one of the transistors that have the thinnest gate dielectric layer is employed as a power source protection element.

In the foregoing embodiment, with respect to the internal circuit 11 including the Lcore and the Mcore, in each of which the thickness of the gate dielectric layer and a threshold voltage Vt are independently set (the thickness of the gate dielectric layer is approx. 2.6 nm and Vt is approx. 0.47 V in the Lcore, and the thickness of the gate dielectric layer is approx. 1.9 nm and Vt is approx. 0.35 V in the Mcore), the Mpcore which has a higher Vt than Mcore (the thickness of the gate dielectric layer is equally approx. 1.9 nm but Vt is higher than that of the Mcore) is employed as a power source protection circuit of the internal circuit 11, suitable for a high speed and low power consumption type LSI being manufactured after introduction of the multi-oxide process for forming two or more gate dielectric layers each having a different thickness.

Accordingly, it is preferable that the Mpcore which serves as the power source protection circuit for the internal circuit 11 (referring only to the Lcore and the Mcore) has a gate dielectric layer thickness of which is thinner than or same as that of the Mcore and a higher Vt than that of the Mcore.

In this embodiment, a higher Vt of the Mpcore is attained by arranging such that a channel dosage for threshold voltage adjustment becomes equivalent to (SRAM+Lcore). In other words, designing a layout so that a channel dosage for the Mpcore becomes equivalent to a total of the SRAM and the Lcore saves an additional process. Also, in case where the Mpcore is designed to have a higher Vt by arranging so that the channel dosage for threshold voltage adjustment becomes equivalent to (Mcore+Lcore), a similar effect can be obtained without need of an additional process.

Consequently, by providing two or more types of gate dielectric layers each having a different film thickness in the internal circuit 11 of the LSI 10 each provided with an MOS device with such the power source protection circuit, leak current can be reduced and the requirements for less leak current and higher breakdown voltage can both be satisfied at a time. Besides, a power source protection circuit with a minimal leak current can be attained without an additional process according to the present embodiment. That is a result of employing the Mpcore which has a lower breakdown voltage than the Lcore as a transistor for the power source protection circuit, as well as of setting a higher threshold voltage for the Mpcore serving as the power source protection circuit than the Mcore in the internal circuit 11.

Further, in the foregoing embodiment a transistor to be employed for constituting a circuit is not limited to one of the conductive types (for example N-channel transistor) employed in the embodiment, but the other conductive type (for example P-channel transistor) can also be employed.

As described above, the invention provides a semiconductor device wherein a transistor that has the thinnest gate dielectric layer is used as a power source protection element, among a plurality of transistors, each having an independently set gate dielectric layer thickness, disposed on a same substrate for operation by a same power source voltage.

Further, a threshold voltage of the transistor which serves as the power source protection element is set higher than that of a transistor that has the thinnest gate dielectric layer. As a result of such arrangement, leak current can be reduced and the requirements for less leak current and higher breakdown voltage can both be satisfied at a time.

Also, through a manufacturing method according to the invention, the above semiconductor device can be obtained.

Although the present invention has been described by way of exemplary embodiments, it should be understood that many changes and substitutions may further be made by those skilled in the art without departing from the scope of the present invention which is defined by the appended claims.

What is claimed is:

1. A semiconductor device comprising:

a substrate; and a plurality of groups of transistors formed on said substrate to be operated by a common voltage generated by a power source, each group of said plurality of groups of transistors having a gate dielectric layer differing in thickness from that of the other groups of said plurality of groups of transistors, wherein one group in said plurality of groups of transistors having a thinnest gate dielectric layer; one transistor in said one group is selected to serve as a power source protection element, wherein said one transistor selected as the power source protection element has a higher threshold voltage than the other transistors in said one group, and wherein said one transistor selected as the power source protection element has a diode type connection.

2. The semiconductor device as set forth in claim 1, wherein said plurality of groups of transistors include at least three types of transistors each having different combinations of thickness of the gate dielectric layer and threshold voltage from each other.

3. The semiconductor device as set forth in claim 1, wherein said plurality of groups of transistors are disposed in an internal circuit surrounded by an I/O interface region.

4. The semiconductor device as set forth in claim 1, wherein said plurality of groups of transistors include a high speed processing type transistor and a low power consumption type transistor, and said transistor selected to serve as the power source protection element has a higher threshold voltage than that of said high speed processing type transistor.

5. The semiconductor device as set forth in claim 1, wherein said plurality of groups of transistors include a high speed processing type transistor and a low power consumption type transistor, and said transistor selected to serve as the power source protection element has a gate dielectric layer thickness which is the same as or thinner than that of said high speed processing type transistor.

6. The semiconductor device as set forth in claim 1, wherein said plurality of groups of transistors include a high speed processing type transistor and a low power consumption type transistor, and leak current of said transistor selected to serve as the power source protection element is smaller than that of said high speed processing type transistor.

7. The semiconductor device as set forth in claim 1, wherein said plurality of groups of transistors include a high speed processing type transistor and a low power consumption type transistor, and said transistor selected to serve as the power source protection element has a higher threshold voltage than that of said high speed processing type transistor, and said transistor selected to serve as the power source protection element has a gate dielectric layer thickness which is the same as or thinner than that of said high speed processing type transistor.

8. The semiconductor device as set forth in claim 7, wherein said plurality of groups of transistors are disposed in an internal circuit surrounded by an I/O interface region.

* * * * *